United States Patent [19]

Maruyama

[11] Patent Number: 5,258,267
[45] Date of Patent: Nov. 2, 1993

[54] PROCESS FOR FORMING RESIST PATTERN

[75] Inventor: Takashi Maruyama, Tokyo, Japan

[73] Assignee: Fujitsu Limited, Kawasaki, Japan

[21] Appl. No.: 629,916

[22] Filed: Dec. 19, 1990

[30] Foreign Application Priority Data

Dec. 22, 1989 [JP] Japan .................. 1-331088

[51] Int. Cl.$^5$ ............................... G03C 5/00
[52] U.S. Cl. .................. 430/328; 430/322; 430/325; 430/331
[58] Field of Search ............ 430/322, 325, 328, 331

[56] References Cited

U.S. PATENT DOCUMENTS 4,361,642 11/1982 Grossa .................. 430/328
4,737,446 4/1988 Cohen .................. 430/315

FOREIGN PATENT DOCUMENTS 1140722 6/1989 Japan .................. 430/328

Primary Examiner—Marion E. McCamish
Assistant Examiner—S. Rosasco
Attorney, Agent, or Firm—Armstrong, Westerman, Hattori, McLeland & Naughton

[57] ABSTRACT

Disclosed is a process for forming a resist pattern, which comprises coating a resist material on a film to be processed, to form a resist film, exposing the resist film to light of a predetermined pattern to form a latent image corresponding to the light pattern, and subjecting the resist film to a development treatment while irradiating the resist film with pulsating rays of the infrared wavelength region at a temperature lower than room temperature. According to this process, a malforming of the pattern due to a swelling of the resist at the development stage is prevented, and an excellent pattern having a high resolving power can be formed.

9 Claims, 2 Drawing Sheets

DEVELOPMENT

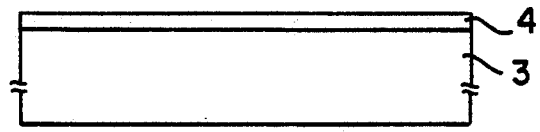
Fig.2A
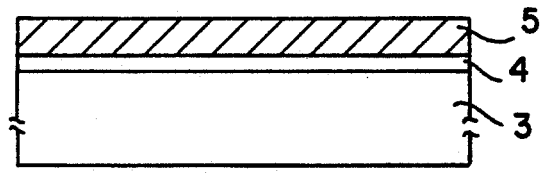
Fig.2B
Fig.2C
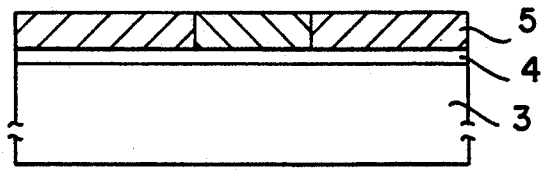
Fig.2D
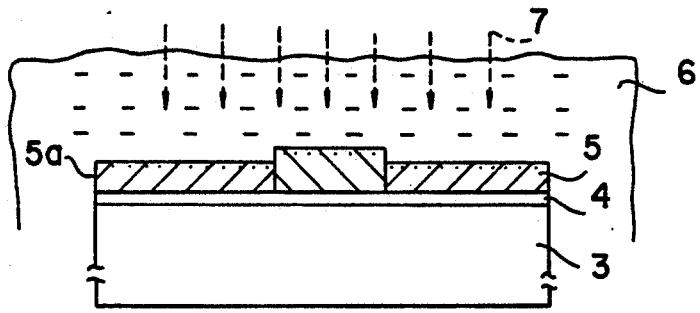
Fig.2E
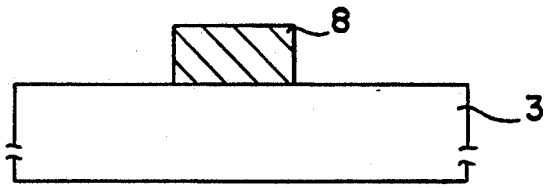

PROCESS FOR FORMING RESIST PATTERN

BACKGROUND OF THE INVENTION

Field of the Invention

The present invention relates to a process for forming a resist pattern. More particularly, the present invention relates to a process for forming a resist pattern, in which the developing step in the photolithographic process is improved and it becomes possible to form a good pattern having a high resolution power.

Description of the Related Art

A semiconductor device is fabricated by patterning a silicon oxide film, a polycrystalline silicon film, and aluminum film and the like, and a resist material such as a photoresist material (photosensitive resin material) is used as a mask for this patterning.

When a photoresist material is used as a mask, as shown in FIGS. 1A-1D, the photoresist material is coated on a film 1, to be processed, by the spin coating method to form a photoresist film 2 (see FIG. 1A), and then the photoresist film 2 is exposed to light (see FIG. 1B) and the photoresist film is subjected to a developing treatment with a liquid developer, to effect a patterning and visualize a latent image of the photoresist film (see FIG. 1C).

After this developing treatment, the film 1 to be processed, which is exposed from the photoresist film 2, is etched to effect patterning (see FIG. 1D).

The photoresists to be used for this photolithographic process are roughly divided into a positive (photosolubilizing) photoresist and a negative (photo-crosslinking) photoresist (used in the process shown in FIGS. 2A-2E). As the positive photoresist, there can be mentioned, for example, a novolak resin and poly(methyl methacrylate) and as the negative photoresist, there can be mentioned poly(glycidyl methacrylate) and chloromethylated polystyrene.

In the fabrication of a semiconductor device by the photolithographic process, a pattern is formed by using a photosensitive resin, but this patterning involves a problem of marring of the pattern due to swelling at the developing step, and this problem is especially serious when a negative crosslinking resist is used. Accordingly, a means for solving this problem is urgently required.

By the term "swelling" as used herein is meant the phenomenon whereby a solvent of a liquid developer permeates the resist material and causes the resist to swell.

Furthermore, in a resist of the type where patterning is effected by utilizing the contrast of the dissolving speed, a malforming of the shape of the side wall of the pattern and a shift in the dimensions are caused by the affect of the liquid developer in the lateral direction of the pattern.

In the conventional lithographic process involving the foregoing problems, as the means for coping with the problem of swelling due to the development, there have been proposed a method in which the composition of the liquid developer is changed, a method in which the temperature of the liquid developer is changed, and a method in which the material of the polymer is changed.

Nevertheless, satisfactory results cannot be obtained by these methods.

Moreover, a method has been adopted in which the material is modified, to increase the contrast of the material, but this modification has an influence on other factors (the sensitivity and resolving power are adversely affected), and therefore, good results cannot be obtained from this method.

The present inventors previously proposed a technique of preventing a swelling of a resist by a liquid developer, and an improvement of the development precision by repeating the supply of the liquid developer to a photoresist film and the drying of the photoresist film a number of times, to visualize a latent image (i.e., an intermittent development process see Japanese Patent Application No. 01-244042). Nevertheless, it has been found that this process is unsatisfactory in that a precise control of the development time is difficult and a good uniformity of the development distribution in the plane of a wafer is difficult to realize.

When a material showing a relatively large swelling is used as the resist material, the swelling is a major cause of a lowering of the resolving power and is a serious rate-controlling element determining the limit of fine processing. Furthermore, swelling plays a major role in the reducing of the process margin.

SUMMARY OF THE INVENTION

The present invention is intended to solve the foregoing problems, and therefore, a primary object of the present invention is to control a swelling of a resist material by a solvent at the developing step in the photolithographic process and greatly improve the resolving power of the resist material.

Another object of the present invention is to provide a process utilizing the contrast of the solubility, in which a malforming of the shape of the side wall of a pattern is prevented, a good shape is formed to improve a transfer precision of a material to be processed, which is located below the pattern, and improvements are obtained with respect to the process margin, reliability, and fine workability.

In accordance with the present invention, these objects can be attained by a process for forming a resist pattern, which comprises coating a resist material on a film to be processed, to form a resist film, exposing the resist film to light of a predetermined pattern, to form a latent image corresponding to the light pattern, and subjecting the resist film to a development treatment while irradiating the resist film with pulsating rays of the infrared wavelength region at a temperature lower than room temperature.

In the process of the present invention, by the term "a temperature lower than room temperature" is meant a temperature in the range of from 20° C. to the melting point of the liquid developer used, preferably from 10° to −100° C., most preferably from −20° to −100° C.

The rays to be applied are rays of the infrared wavelength region, preferably infrared rays having a wavelength of from 2 to 25μ, but normal visible rays also can be used.

BRIEF DESCRIPTION OF THE DRAWINGS

FIGS. 2A through 2E are step diagrams illustrating one embodiment of the process for forming a resist pattern according to the present invention.

DESCRIPTION OF THE PREFERRED EMBODIMENTS

Figure 1A:
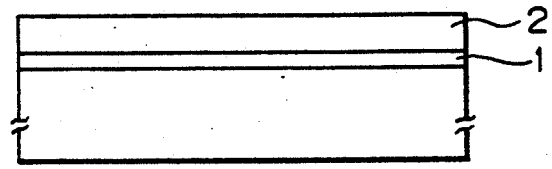
FIGS. 1A through 1D are step diagrams illustrating the conventional process for forming a resist pattern.
Figure 1B:
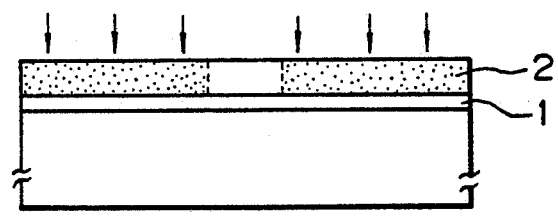
Figure 1C:
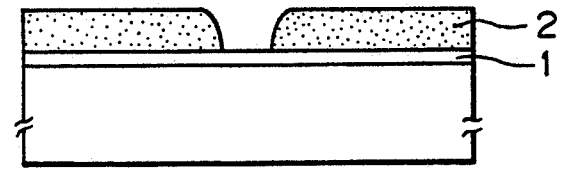
Figure 1D:
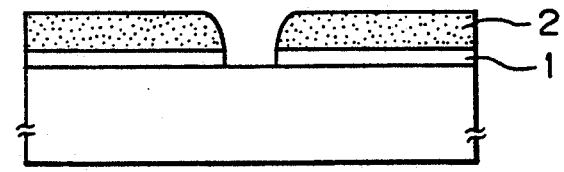

Preferred embodiments of the process of the present invention will now be described in detail with reference to FIGS. 2A–2E of the accompanying drawings.

A resist material 5 is coated on a film 4 to be processed, which is formed on a semiconductor substrate 3 (see FIG. 2B).

As the film to be processed, there can be mentioned, for example, an Al alloy to be used as a wiring material in the process for fabricating a semiconductor device such as an LSI, a polysilicon material to be used as a gate material, and a silicon oxide film.

Either a negative resist material or a positive resist material can be used as the resist material in the present invention, and preferably a photosensitive polymer is used. Appropriate photosensitive polymers include, for example, polystyrene, chloromethylated polystyrene, polysiloxanes, polyacrylates, polymethacrylates, methacrylate copolymers, cyclic rubbers, polyvinyl cinnamate, polysulfones, crosslinking polymers, and derivatives of these polymers. The spin coating method can be advantageously adopted for coating a resist material as mentioned above, but other customary coating methods also can be adopted. The molecular weight of a photosensitive polymer advantageously used in the present invention, especially a photosensitive crosslinking polymer, can be changed over a broad range, but the molecular weight is generally in the range of from about 1,000 to about 1,000,000.

Then, the formed resist film is exposed to light of a predetermined pattern (see FIG. 2C). For example, where the rays to be applied are electron beams, an electron beam lithographic apparatus can be used, and if X-rays or ultraviolet rays are used, the pattern light exposure can be performed by using a photomask.

Then, the development is carried out by immersion in a liquid developer 6. At this treatment, the temperature of the developing system, i.e., the temperature of the liquid developer and the substrate which has been subjected to the light exposure treatment, is maintained at a low level (10° to −100° C.) and pulsating rays 7 are applied to the resist film from above (see FIG. 2D).

The developing system is maintained at a low temperature in the present invention because the diffusion of the solvent into the resist in the liquid developer is controlled by maintaining the system at a low temperature.

Namely, if the development is carried out at a normal temperature as in the conventional process, the speed of the diffusion of the liquid developer in the resist (polymer) is very high and the swelling equilibrium is obtained in the polymer only within several seconds. Once the swelling equilibrium is obtained, a drastic deformation of the pattern and an insufficient resolution are caused even after the subsequent rinsing and drying treatments.

In contrast, if the developing system is maintained at a low temperature, a considerably long time is needed to arrive at the swelling equilibrium. Accordingly, the dissolving speed of the resist is reduced and the development time is prolonged.

To alleviate this disadvantage, in the process of the present invention, the development is accomplished by irradiating the resist film with pulsating rays while maintaining the developing system at a low temperature. By irradiation with rays, especially rays having a wavelength that can be easily absorbed in the resist (polymer), for example, near infrared rays, the surface temperature of the resist is elevated and the dissolution reaction occurs only in the interface between the resist and the liquid developer. By adopting such a procedure, it becomes possible to advance the development and dissolution while controlling the swelling of the resist. Moreover, the process of the present invention is advantageous in that the drying step as adopted in the conventional process (see, for example, Japanese Patent Application No. 01-244042) is not necessary, because the liquid developer does not intrude into the resist.

FIG. 2D is a step diagram illustrating the intermediate state at the developing step. The portion 5a indicated by a dot line is a portion at which the temperature of the resist is elevated by an irradiation with pulsating rays. If the resist is continuously irradiated with rays even the lower part of the resist is heated, and if even the lower part of the temperature is elevated, the speed of intrusion of the solvent into the polymer below the surface of the resist is increased, and a swelling of the resist is caused and the disadvantages as mentioned above are brought about.

In the process of the present invention, to prevent a swelling of the resist as mentioned above, the solvent is inhibited from intruding into the deep portion of the resist, and only an intrusion of the solvent in the surface portion of the resist is allowed. To realize this feature, the elevation of the temperature in only the surface portion of the resist is realized by an irradiation with pulsating rays (especially infrared rays).

The frequency of the irradiation with pulsating rays is at least 2 $\mu$sec. If the frequency is lower than 2 $\mu$sec, the surface temperature is excessively elevated and good results can not be obtained.

The irradiation intensity is 10 to $10^7$ W/cm$^2$. If the irradiation intensity is lower than 10 W/cm$^2$, the temperature of the resist is not sufficiently elevated, and if the irradiation intensity exceeds $10^7$ W/cm$^2$, the resist temperature is excessively elevated.

In the process of the present invention, it is most important that the applied rays have a wavelength that cannot be absorbed in the liquid developer. This is because, if the rays are absorbed in the liquid developer (solvent), the temperature of the developing system, which should be maintained at a low temperature, is elevated. Furthermore, if the rays are absorbed in the liquid developer, the rays cannot reach the surface of the resist to be subjected to the development treatment.

Therefore, the wavelength, intensity and the like of the rays to be applied should be selected so that the resist pattern is not changed by the pulsating rays used, the absorption by the liquid developer is very small as pointed out above, and the absorption by the resist (polymer) is large.

A desired pattern (negative pattern in present embodiment) 8 is obtained according to the above-mentioned process (see FIG. 2E).

Even if a usual novolak resist capable of forming a pattern by utilizing the dissolution contrast with controlled swelling is used, the intended effect of improving the resolving power according to the present invention still can be obtained. In this case, an allocation of parallel rays to the substrate is preferred. Since the entire system is maintained at a very low temperature, the dissolution speed of the entire system is very low. If parallel pulsating rays are applied orthogonally to this substrate, only the top surfaces of the pattern and the unexposed portion to be removed by the dissolution are heated, and the temperature is elevated only in these top surface portions. Accordingly, the side face of the pattern is not irradiated with the rays, and therefore, the elevation of the temperature is very small in the side face portion of the pattern and the dissolution speed is kept very low. Therefore, since the dissolution of the pattern from the side wall is greatly delayed, a good shape is maintained in the side wall of the formed pattern.

The present invention will now be described in detail with reference to the following examples.

EXAMPLE 1

An embodiment in which a CMS (chloromethylated polystyrene) resist (polystyrene type negative electron beam resist) is used as the photoresist and acetone or isoamyl acetate is used as the liquid developer will now be described.

The CMS resist (having a weight average molecular weight of 10,000) was coated in a thickness of 2 μm on a film to be processed, which was formed on a silicon substrate, by the spin coating method, and a soft baking was carried out for 100 seconds at 80° C., using a hot plate.

Then, the light exposure was carried out by using electron beams (30 KV, 4.5 E$^{-5}$ C/cm$^2$). The light-exposed substrate was developed with a liquid developer (acetone or isoamyl acetate) by using a developing apparatus cooled by He gas or the like while irradiating the resist with light. The temperature of the developing system was controlled to $-70°$ C. The irradiation conditions are not particularly critical, as long as the light exposure characteristics are not adversely influenced, but preferably the irradiation intensity is controlled so that the surface temperature of the resist is in the vicinity of room temperature. Moreover, to elevate the temperature only in the surface portion of the resist, preferably light that can be absorbed in the polymer is used. More specifically, in the present example, infrared rays having a wavelength of 600 cm$^{-1}$ or 1250 cm$^{-1}$ were used.

The reason why infrared rays having such a wavelength were used is that the CMS resist used in the present example has a strong absorbing property [the characteristic peaks at 600 cm$^{-1}$ and 1250 cm$^{-1}$ in the IR chart, which are attributed to C-Cl and CH$_2$-Cl, are very strong and the irradiated rays are not absorbed by the liquid developer (acetone). The irradiation intensity and frequency should be changed according to the temperature of the liquid developer. In the present example, the power density was 10$^5$ W/cm$^2$, the frequency was 10 μsec, and the width of one pulse was 1 μsec.

The total development time was 60 seconds.

When the development was carried out under the above-mentioned conditions, a fine pattern having a very good shape was obtained.

The relationship between the swelling and the temperature and the relationship between the temperature of the developing system and the speed of diffusion of the solvent in the polymer will now be described.

The relationship between the swelling and the temperature is represented by the following formula (I):

$$V = C\left[A - \frac{B}{T}\right]^{3/5} \quad (I)$$

wherein V represents the swelling ratio, A, B and C are constants inherent to the material but irrelevant to the temperature, and T represents the absolute temperature (°K.).

Note, the swelling ratio is the ratio of the volume of the resist which is in contact with the developing solvent in the equilibrium state to the volume of the resist in the initial stage before the intrusion of the solvent.

As apparent from the foregoing formula, the swelling is reduced as the temperature drops.

The relationship between the temperature of the liquid developer (solvent) and the speed of diffusion of the solvent in the resist (polymer) was examined. Polystyrene (having a molecular weight of 74,000) was used as the resist and amyl acetate was used as the solvent. The results are shown in Table 1.

TABLE 1

| | 40° C. | 20° C. | $-20°$ C. | $-40°$ C. | $-60°$ C. | $-80°$ C. |
|---|---|---|---|---|---|---|
| Diffusion speed (relative value calculated based on the supposition that the value at 20° C. is 1) | 2 | 1 | $\frac{1}{5.5}$ | $\frac{1}{17}$ | $\frac{1}{60}$ | $\frac{1}{288}$ |

As apparent from Table 1, the speed of diffusion of the solvent in the polymer drops as the temperature drops. Note, the diffusion speed at $-80°$ C. is 1/288 of the diffusion speed at 20° C.

As understood from the foregoing results, according to the present invention, the swelling of the resist is controlled by maintaining the developing system at a low temperature, and the reduction of the developing speed by maintaining the developing system at a low temperature is compensated by an irradiation with pulsating rays. Namely, by the irradiation with pulsating rays, only the temperature of the interface of the resist is elevated, whereby the dissolution reaction is advanced only in the interface and a good pattern is formed.

EXAMPLE 2 AND COMPARATIVE EXAMPLE

A positive resist (supplied by Nippon Zeon) comprising a methyl methacrylate/methacrylic acid copolymer and a methyl methacrylate/methacrylic chloride copolymer was used as the photoresist, and a 1/1 mixed solvent of methylisobutyl ketone (MIBK) and ethyl acetate was used as the liquid developer. Isopropyl alcohol was used as the rinsing liquid.

The positive resist was coated in a thickness of at least 2 μm on a film (for example, an aluminum film) to be processed, which was formed on a silicon substrate. Then, the light exposure was carried out, and the development treatment was carried out in the following manner. The temperature in the liquid developer was maintained at $-50°$ C., and pulsating rays having a wavelength of 760 cm$^{-1}$ were applied at an irradiation intensity of $10^5$ W/cm$^2$ and a frequency of 5 μsec. The width of one pulse was 1 μsec, and the total developing time was 150 seconds. After the development a rinsing operation was carried out, and a formation of cracks was not observed, and a good pattern having a high resolution power was obtained.

The reason why rays having a wavelength of 760 cm$^{-1}$ were selected in the present example is that no characteristic absorption peak was found at 760 cm$^{-1}$ in any of the infrared absorption spectra of MIBK and ethyl acetate constituting the liquid developer, and therefore, it is considered that rays having the above-mentioned wavelength are little absorbed in the above-mentioned mixed solvent. In the infrared absorption spectrum chart of polymethyl methacrylate (PMMA) as the main component of the copolymer mixture used, a characteristic absorption peak is present in the vicinity of 760 cm$^{-1}$. Accordingly, it is considered that rays having the above-mentioned wavelength are strongly absorbed in the resist.

As apparent from the results of the present example, the process of the present invention is effective as a means for preventing cracking in a positive photoresist.

For comparison, after the light exposure, the usual development treatment was carried out without maintaining the developing system at a low temperature and irradiation with pulsating rays. More specifically, the development was conducted for 20 seconds according to the spray method, and subsequently, the rising operation was carried out for 10 seconds. A formation of cracks was observed in the obtained positive pattern.

OTHER EXAMPLES

In the foregoing examples, chloromethylated polystyrene or the PMMA copolymer was used and developed with the MIBK/ethyl acetate mixed solvent or the like. Note, other materials can be used and preferred patterns can be obtained. For example, the materials described below can be used.

Namely, chloromelthylated polydiphenylsiloxane (SNR) and polymethylsilcesusiloxane (PMSS) can be used as the photoresist material, and films composed of these photoresist materials can be developed with ketone solvents such as methylisobutyl ketone (MIBK) and methylethyl ketone (MEK) and ester solvents such as ethyl acetate. Furthermore, a photoresist film composed of a material such as polydiallyl orthophthalate (PDAOP) can be developed with a liquid containing monochlorobenzene and isoamyl phosphate, and films of photoresist materials such as polyglycidyl methacrylate and a glycidyl methacrylate/ethyl acrylate copolymer can be developed with acetone and isopropyl alcohol. In all of the foregoing developments, by maintaining the photoresist film and liquid developer at a low temperature at the development and irradiating the photoresist film with pulsating light, good patterns can be effectively formed.

Furthermore, a cyclic rubber resist material, a polyvinyl cinnamate resist material, a styrene type resist material, an acrylic resist material, a silicon type resist material and other crosslinking resist material can be advantageously applied to the process of the present invention.

As apparent from the foregoing description, according to the present invention, at the development step of the lithographic process, the development is carried out in the state where the light-exposed photoresist film is maintained at a temperature lower than room temperature while the photoresist film is irradiated with pulsating light, and by adopting this structure, swelling at the developing step can be controlled to a lowest level, and a meandering deformation of a fine pattern and reduction of the resolving power by a generation of scum in a microgap pattern or generation of a bridge can be prevented, with the result that an excellent pattern having a high resolving power can be obtained. Furthermore, in the process of the present invention, the frequency, pulse width and intensity of the pulsating light can be controlled more easily than in the intermittent developing process, and therefore, the developing time controllability can be further improved. Also by dint of this feature, an excellent pattern having a high resolution power can be obtained.

Moreover, the process of the present invention is advantageous over the intermittent developing process in that the development is accomplished more uniformly. Further, since the drying step is not necessary in the process of the present invention, the throughput can be improved.

Still further, where a resist of the type utilizing the dissolution contrast of patterning is used, an improvement of the shape of the side wall can be obtained.

Accordingly, the process of the present invention makes a great contribution to an increase of the pattern fineness and increase of the integration degree, and in the conventional process for fabricating elements, the reliability can be improved through a maintenance of a larger process margin when the process of the present invention is adopted.

While the invention has been particularly shown and described in reference to preferred embodiments thereof, it will be understood by those skilled in the art that changes in form and details may be made therein without departing from the spirit and scope of the invention.

I claim:

1. A process for forming a resist pattern, comprising the steps of:
    coating a resist material on a film to be processed so as to form a resist film;
    exposing the resist film to light of a predetermined pattern so as to form a latent image corresponding to the light pattern;
    subjecting the resist film to a liquid development treatment, while irradiating the resist film with pulsating rays of the infrared wavelength region at a temperature lower than room temperature, wherein the pulsating rays have the infrared wavelength which can heat only the surface of the resist film, and wherein the latent image which is formed corresponding to the light pattern is unchanged by the pulsating rays of the infrared wavelength region.

2. A process according to claim 1, wherein the resist material is a photosensitive polymer selected from the group consisting of polystyrene, polysiloxanes, polyacrylates, polymethacrylates, cyclic rubbers, polyvinyl cinnamate, polysulfones, other crosslinking polymers and derivatives thereof.

3. A process according to claim 1, wherein the resist material is a negative resist and a negative resist pattern is formed.

4. A process according to claim 1, wherein the resist material is a positive resist and a positive resist pattern is formed.

5. A process according to claim 1, wherein the resist material is a photosensitive polymer and the resist film is developed at a temperature range of between 10° C. and −100° C., while the resist film is irradiated with pulsating rays of the infrared wavelength region.

6. A process according to claim 1 or 2, wherein the resist film is developed while irradiating the resist film with the rays at an irradiation pulse frequency of at least 2 μsec.

7. A process according to any of claims 1 or 2, wherein the resist film is developed while irradiating the resist film with the rays at a power density of 10 to $10^7$ W/cm$^2$.

8. A process according to any of claims 1 or 2, wherein the resist film is developed while irradiating the resist film with infrared rays having a wavelength of 2 to 25μ.

9. A process for forming a resist pattern, comprising the steps of:
- coating a resist material on a film to be processed so as to form a resist film;
- exposing the resist film to light of a predetermined pattern so as to form a latent image corresponding to the light pattern;
- subjecting the resist film to a liquid development treatment, while irradiating the resist film with pulsating rays of the infrared wavelength region at a temperature lower than room temperature, wherein the resist material is a photosensitive polymer and the resist film is developed at a temperature range of between 10° C. and −100° C.

* * * * *